United States Patent
Feurle et al.

(10) Patent No.: US 6,816,432 B2
(45) Date of Patent: Nov. 9, 2004

(54) INTEGRATED SEMICONDUCTOR CIRCUIT HAVING TRANSISTORS THAT ARE SWITCHED WITH DIFFERENT FREQUENCIES

(75) Inventors: Robert Feurle, Neubiberg (DE); Dominique Savignac, Ismaning (DE)

(73) Assignee: Infineon Technologies AG, Munich (DE)

( * ) Notice: Subject to any disclaimer, the term of this patent is extended or adjusted under 35 U.S.C. 154(b) by 234 days.

(21) Appl. No.: 10/146,582

(22) Filed: May 15, 2002

(65) Prior Publication Data

US 2002/0172071 A1 Nov. 21, 2002

(30) Foreign Application Priority Data

May 15, 2001 (DE) .......................................... 101 23 594

(51) Int. Cl.[7] .............................. G11C 8/00; G11C 5/06
(52) U.S. Cl. .......................... 365/233; 365/226; 365/63
(58) Field of Search ................................ 365/233, 226, 365/63

(56) References Cited

U.S. PATENT DOCUMENTS

| | | | | |
|---|---|---|---|---|
| 5,886,918 A | * | 3/1999 | Nakamura | .................... 365/63 |
| 5,926,729 A | | 7/1999 | Tsai et al. | |
| 6,097,641 A | | 8/2000 | Lu et al. | |
| 6,229,758 B1 | * | 5/2001 | Agata | .......................... 365/233 |
| 6,515,918 B2 | * | 2/2003 | Mizuno et al. | ............. 365/226 |

FOREIGN PATENT DOCUMENTS

DE  197 35 826 A1  3/1999

OTHER PUBLICATIONS

Diodato, P.: "Embedded DRAM: More than Just a Memory", IEEE Communications Magazine, Jul. 2000, pp. 118–126.

Han, L. et al.: "A Modular 0.13 $\mu$m Bulk CMOS Technology for High Performance and Low Power Applications", IEEE, 2000, pp. 12–13.

Ishiuchi, H. et al.: "Embedded DRAM Technologies", IEEE, 1997, pp. 2.3.1–2.3.4.

Liu, C. et al.: "Multiple Gate Oxide Thickness for 2GHz System-on-A-Chip Technologies", IEEE, 1998, pp. 21.2.1–21.2.4.

* cited by examiner

Primary Examiner—Trong Phan
(74) Attorney, Agent, or Firm—Laurence A. Greenberg; Werner H. Stemer; Ralph E. Locher

(57) ABSTRACT

It is known to adapt the dimensions of transistors, in particular a layer thickness of a local gate oxide in a manner dependent on an operating voltage. Therefore, semiconductor circuits having transistors with different operating voltages are provided with transistors having gate oxides of different thicknesses. This allows the gate oxide thickness to be influenced even more extensively. In this case, account is taken of the fact that infrequently addressed transistors, in particular memory transistors given the same gate oxide thickness, have a significantly longer lifetime than frequently switched transistors. An integrated semiconductor circuit having transistors whose gate oxide thicknesses are adapted to the switching frequency having different magnitudes, is proposed.

14 Claims, 3 Drawing Sheets

INTEGRATED SEMICONDUCTOR CIRCUIT HAVING TRANSISTORS THAT ARE SWITCHED WITH DIFFERENT FREQUENCIES

BACKGROUND OF THE INVENTION

Field of the Invention

The invention relates to an integrated semiconductor circuit having at least two transistors, which are both operated with a first operating voltage and which each have a control electrode and a layer of a dielectric adjacent to the respective control electrode. The first and second transistors are connected up in such a way that the first and second transistors are switched with different frequencies on average over time. An average switching frequency of the second transistor is less than an average switching frequency of the first transistor.

Such semiconductor circuits have been customary for decades in semiconductor technology and are predominantly produced from MOSFETs in CMOS technology i.e. as a combination of n-channel transistors and p-channel transistors. It is usual for the source and drain of the transistors to be implanted into the semiconductor substrate after the prior patterning, in their center, of a dielectric, usually made of an oxidic material such as silicon dioxide, with the overlying gate contact.

Depending on the application purpose, vertical transistors with a source-drain channel running perpendicularly to the substrate surface are also produced. Moreover, there are further conceivable configurations of transistors that likewise have a control electrode that, in a similar manner to the gate electrode of a MOSFET, is isolated from the further electrodes of the transistor by a dielectric.

In MOSFETs, the electric field strength penetrating through the dielectric controls the formation of a channel between the remaining transistor electrodes. A switching operation alters the voltage between the gate and the source and, depending on the type of MOSFET, effects or prevents the formation of a channel beneath the dielectric.

In order to enable the channel formation to be controlled as directly and controllably as possible, the dielectric, which is usually a limited aereal region of a layer deposited on the semiconductor substrate is made as thin as possible. The layer thickness of the dielectric, typically being a few nanometers, is significantly less than the layer thickness of the overlying gate layers, but must be large enough to prevent tunneling through the dielectric on account of the fields present. Proceeding from this necessity, the layer thickness of the dielectric is always chosen to be as small as possible, in order to control the transistor optimally.

What are of particular importance for the electrical switching behavior of the transistor are its short-channel behavior and its transistor performance. A decreasing gate length is accompanied by a decrease in the saturation current that can be achieved between source and drain. It is nevertheless necessary, despite the advancing miniaturization of the transistors, to ensure a sufficiently high saturation current. This is all the more important the smaller the dimensioning of the gate length. At the present time, reliable transistors having gate lengths of less than 150 nm are produced.

Also of importance is the threshold voltage, at which the MOSFET switches, i.e. at which the formation or the collapse of the channel between the source and drain commences. The lower the threshold voltage, the more easily the transistor can be controlled.

For these reasons, for decades the layer thickness of the dielectric of the transistors has been made as small as possible and approximated as far as possible to the minimum layer thickness at which, depending on the semiconductor generation, reliable operation of the transistors is still possible.

More complex circuits often have regions in which transistors are supplied with different operating voltages. Roughly, a distinction can be made between low-voltage transistors having an operating voltage of between 1 and 5 V, high-voltage transistors having an operating voltage of between 10 and 20 V and power transistors having an operating voltage of above 40 V. The different supply voltages require the transistors to have dimensions of different magnitudes. However, transistors are dimensioned in different sizes also in the case of significantly smaller voltage differences within a single region, for instance in that of the low-voltage transistors. It is known, for instance, in the case of transistors operated with different supply voltages, to configure the layer thickness of the respective dielectric with different magnitudes in order to achieve a lifetime that is approximately of the same length for both transistors. Thus, differences between the operating voltages of a few volts typically lead to layer thickness differences of the order of magnitude of a few nanometers.

This measure has long resulted in an approximately identical reliability of different transistors in regions of different supply voltages within an integrated semiconductor circuit.

Furthermore, there continue to exist integrated semiconductor circuits whose transistors are configured for a uniform operating voltage.

SUMMARY OF THE INVENTION

It is accordingly an object of the invention to provide an integrated semiconductor circuit having transistors that are switched with different frequencies that overcomes the above-mentioned disadvantages of the prior art devices of this general type, in which the reliability and the controllability of such semiconductor circuits are improved. In particular, the object of the invention is, with the lifetime of an integrated circuit remaining the same, to further improve its controllability at least in partial regions or, with no reduction in the controllability, to affect an overall increase in the lifetime of the circuit.

With the foregoing and other objects in view there is provided, in accordance with the invention, an integrated semiconductor circuit. The integrated semiconductor circuit contains two transistors, including a first transistor and a second transistor, operated with an operating voltage. The two transistors are connected up such that the transistors are switched with different frequencies on average over time, the second transistor having an average switching frequency less than an average switching frequency of the first transistor.

The first transistor has a first control electrode and a first dielectric layer disposed adjacent to the first control electrode, and the second transistor has a second control electrode and a second dielectric layer disposed adjacent to the second control electrode. The second dielectric layer has a given thickness that is less than a given thickness of the first dielectric layer.

The object is achieved according to the invention by virtue of the fact that the layer thickness of the dielectric of the second, less frequently switched transistor, i.e. of the second dielectric, is less than the layer thickness of the dielectric of the first, more frequently switched transistor, i.e. of the first dielectric.

The present invention exploits the fact that different transistors of a semiconductor circuit are addressed with different frequencies. The frequency with which a transistor is switched back and forth between its on state and its off state varies depending on the function and configuration of the transistor within the semiconductor circuit.

Semiconductor circuits are usually clocked with a predetermined frequency, so that a check and, if appropriate, a change of the switching states takes place at discrete, very short time intervals. Considered over many clock periods, it is possible to specify a probability value for the probability with which a specific transistor is switched per clock cycle. The switching probability or switching frequency is inversely proportional to the average temporal duration of a switching state of this transistor, i.e. to the average time interval between successive switching times. The latter differs depending on the transistor and may vary by several powers of 10 between transistors of different regions of the semiconductor circuit.

The invention exploits the fact that the probability of tunneling through the dielectric is reduced and hence the lifetime of the transistor is increased if the transistor is switched only very infrequently measured by the clock frequency. In comparison with other transistors, which are switched approximately with the same frequency as the clock frequency, such a transistor has a much longer potential lifetime. Nevertheless, the dimensioning of such transistors in conventional semiconductor circuits does not differ from that of the frequently switched transistors. Only in those semiconductor circuits that have regions with different transistor operating voltages has the layer thickness of the dielectric been varied hitherto over the semiconductor surface.

In contrast, according to the invention, the layer thickness of the dielectric of the transistors that are switched less frequently is reduced further. The dielectric of the transistor is made so thin that its lifetime corresponds approximately to the lifetime of the frequently utilized transistors. In this way, the layer thicknesses of the dielectrics of both transistors are coordinated with one another in a manner dependent on their respective average temporal switching interval. The fact that the layer thickness of the dielectric of the second, less frequently switched transistor (i.e. of the second dielectric) is chosen to be less than the layer thickness of the dielectric of the first, more frequently switched transistor (i.e. of the first dielectric) results in that, with the lifetime of the integrated circuit remaining the same, its controllability is improved in the region of the second transistor.

The layer thickness of the second dielectric is reduced to such an extent that the lifetime of the first and the lifetime of the second transistor are matched to one another. It is not necessary for an infrequently switched transistor to have a lifetime years longer than that of a frequently switched transistor and hence the integrated semiconductor circuit overall. In contrast, the dielectric layer thickness reduction that is performed in a manner dependent on the switching frequency improves the controllability at least of the less frequently switched transistors; their performance and their short-channel behavior are improved. Proceeding from the layer thicknesses that are already kept small, the layer thickness can be reduced still further in those regions in which transistors are addressed infrequently. An even higher degree of controllability is obtained as a result.

The concept of the invention can be applied both to circuits having a uniform supply voltage and to those having different operating voltages. In the latter case, those transistors that have the larger layer thickness can also easily be reduced in size in order to improve the controllability in regions of higher operating voltage. Furthermore, the layer thicknesses of the dielectrics of the smaller transistors can be reduced to an even greater extent if the lifetime of the semiconductor circuit is limited by the region of higher operating voltages.

In all cases, the present invention leads to an improvement of the switching behavior at least in partial regions of the circuit.

With regard to the extent of the layer thickness variation, a preferred embodiment provides for the layer thickness of the second dielectric to be from 1 to 15% less than the layer thickness of the first dielectric. The moderate reduction takes account of the fact that layer thicknesses have already long been optimized to the technically reliable minimum. With regard to this, smaller layer thickness corrections below the range mentioned are still possible, of course, in order to preclude the risk of tunneling through the dielectric.

A preferred embodiment therefore provides for the switching frequency of the second transistor to be a factor of from 100 to $10^7$ less than the switching frequency of the first transistor. Although it is possible to utilize even smaller ratios of the switching frequency with respect to a layer thickness variation, precisely the greatest fluctuations of the switching frequency will give cause for a configuration correction.

Of course, a layer thickness variation is all the more appropriate in the case of still larger differences in the switching frequency.

A preferred embodiment provides for the second transistor to be a selection transistor by which a memory cell in a memory cell array is selected. In a semiconductor memory having a multiplicity of memory cells, an individual cell is naturally addressed very infrequently, namely only when the information of the respective memory cell is interrogated or altered. By virtue of the large number of memory cells in a memory cell array, the selection transistors of memory cells are addressed much more infrequently than other transistors of the same semiconductor circuit. Therefore, large differences in the frequency of the addressing of different transistors occur precisely in semiconductor memories.

A development of the embodiment provides for the first transistor to be a transistor by which a row path, i.e. a word line is selected, to which a multiplicity of second transistors are connected. The addressing of a specific memory cell results from the simultaneous selection of the relevant word line and of the relevant bit line. In this case, quite a lot of memory cells or selection transistors are connected to each word line. If a specific word line is switched or selected, then potentially every memory cell connected to the word line can be interrogated. For this purpose, the corresponding bit line must also be selected. Since quite a lot of selection transistors of individual memory cells are connected to each individual word line, the selection transistors are switched much more infrequently than the transistors that are responsible for the selection of the word line. Thus, in accordance with the development described here, the selection transistors of the memory cells are provided with a thinner dielectric than the selection transistors for the word lines.

A preferred embodiment with regard to the number of second transistors per word line provides for between a thousand and hundred thousand selection transistors to be connected to the row path which includes the first transistor.

A development of the invention provides for a third transistor to be provided, whose operating voltage is less than that of the first and second transistors and which has a third dielectric whose layer thickness is less than the layer thickness of the second dielectric. In this case, the three transistors have three different layer thicknesses of their respective dielectric but are provided with a total of two different operating voltages. Accordingly, the dimensioning of the three transistors is adapted to two supplied thermal powers of different magnitudes per switching operation and to three different switching frequencies that is manifested in a corresponding dimensioning of the transistor dimensions.

A development of this embodiment provides for the third transistor to be a transistor of a data path that forwards information from the memory cells. In semiconductor memories the data paths—usually running in an interface—are operated with a lower operating voltage than memory cells, which have to store information for a relatively long time. In this case, the layer thicknesses of the different dielectrics are set among one another in a manner dependent both on the respective operating voltage and on the respective switching frequency.

A further development of the invention provides for at least four transistors each having a dielectric to be provided, the dielectrics having four different layer thicknesses. The embodiment with a total of four different layer thicknesses of the dielectrics can still be produced relatively cost-effectively. In order to alter the layer thickness of the dielectric—generally of the gate oxide—across the semiconductor surface, the substrate surface is configured differently in a manner known per se, for instance provided with different layers or implantations, which results in gate oxide growth rates of different magnitudes. In addition, the gate oxide can also be removed by partial etching-back in a few aereal regions. Each intervention generally requires a mask and hence additional work outlay. However, it leads to two different layer thicknesses of the dielectric. If only two such steps are combined with one another, up to four possible different layer thicknesses and hence a very complex control method for optimization of the switching behavior of the transistors are obtained.

A preferred embodiment provides for the transistors to be MOSFETs and the control electrodes to be gate electrodes. The field-effect transistors can be applied as planar transistors to a gate oxide that has been produced, or also be produced as vertical transistors in specific applications. In addition, any other conceivable construction of a transistor can be optimized with the aid of the present invention. In particular, it is provided that the dielectrics of all the transistors are gate oxides. This applies at least to the dielectric of the first, second and third and also fourth transistor. In terms of fabrication engineering, first a gate oxide whose thickness varies in regions is produced and subsequently patterned in the context of the transistor fabrication.

It is preferably provided that the integrated semiconductor circuit is configured for a defined clock frequency and that the average switching frequency of a transistor is proportional to the duty ratio of the transistor. A characteristic quantity for the switching frequency of a transistor is the duty cycle. The duty cycle designates the average duration of an off or on state of a transistor between successive switching states. The duty cycle thus corresponds to the reciprocal of the switching frequency of the transistor on average over time. The duty cycle is often specified by a natural number. A duty cycle of 1000 results in that a transistor is switched on average after the $1000^{th}$ clock cycle. On the other hand, the duty cycle is also colloquially expressed as a percentage, which ultimately means the switching frequency. Thus, a "duty cycle" of 10% corresponds to a switching probability of 0.1.

Often, transistors predominantly remain in the off state and are only occasionally switched into the on state for a clock period. In the next clock cycle, they are immediately put into the off state again. Since exactly two switching operations are required in each case for such a pulse the switching frequency can readily be specified by the so-called duty ratio. The duty ratio designates the ratio of the time during which a transistor is in its on state in comparison with the time duration during which the transistor is in the off state. The duty ratio, i.e. the ratio of the temporal duration of on state to off state, corresponds to the switching frequency except for a factor of 2.

The invention can be used in any type of semiconductor circuit and, on account of the generality of the concept of the invention, which is not geared toward a specific purpose of the circuit, can be applied to any semiconductor device. In particular semiconductor memories, in particular embedded DRAMs and also logic circuits are appropriate. Memories are distinguished by a high number of memory cells and hence memory transistors whose information is changed extremely infrequently in regions and whose addressing frequency is therefore many orders of magnitude below the clock frequency. Therefore, the inventive variation of the gate oxide thicknesses in memories leads to a particularly large increase in the controllability. This advantage can equally be utilized in embedded DRAMs that are constructed as memory areas in application specific integrated circuits constructed for more complex tasks.

Other features which are considered as characteristic for the invention are set forth in the appended claims.

Although the invention is illustrated and described herein as embodied in an integrated semiconductor circuit having transistors that are switched with different frequencies, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
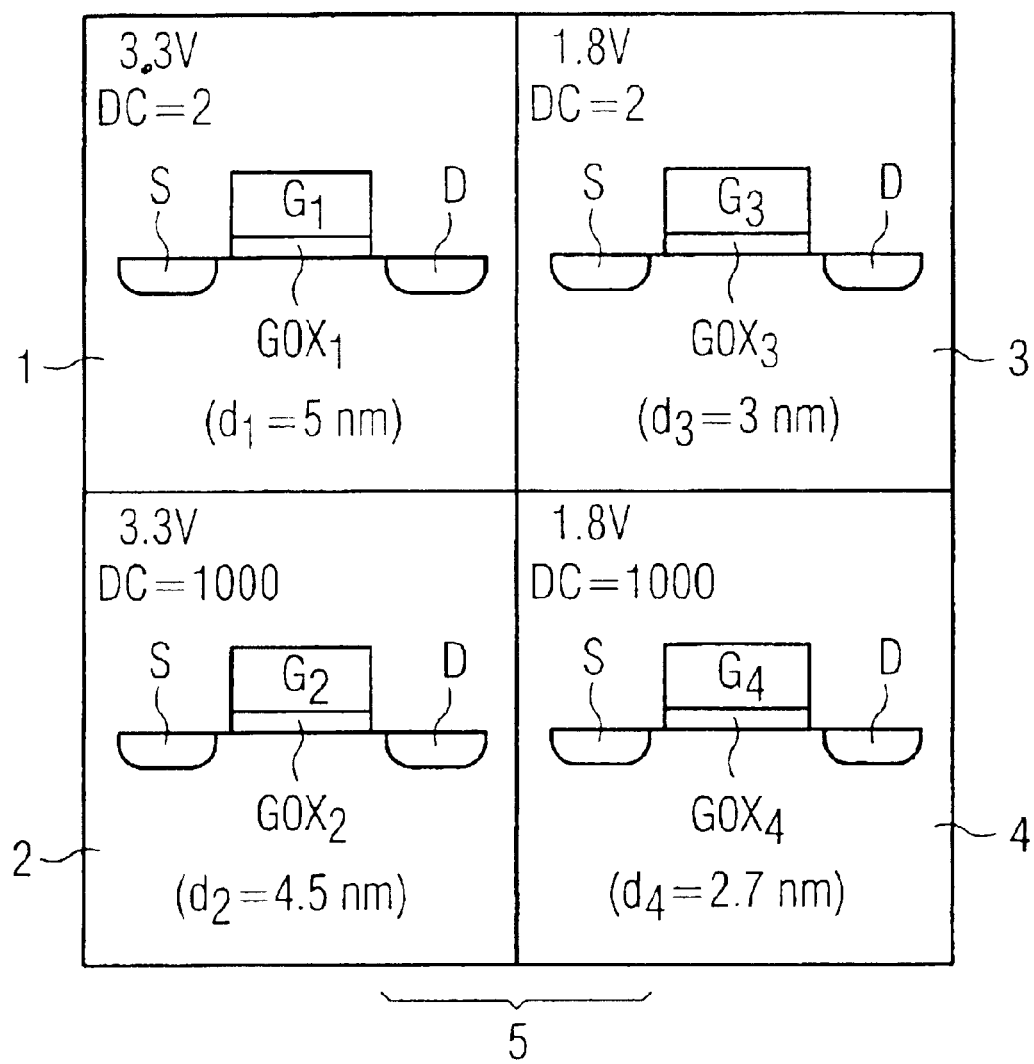
FIG. 1 is a diagrammatic illustration of a semiconductor circuit according to the invention.

Referring now to the figures of the drawing in detail and first, particularly, to FIG. 1 thereof, there is shown a semiconductor circuit 5 illustrated that has four regions which are operated with a total of two operating voltages of 3.3 V and 1.8 V. Accordingly, as is customary according to the prior art, the layer thicknesses are roughly adapted to the operating voltage respectively present. Transistors 1 and 2 illustrated on the left-hand side have a gate oxide that, has a thickness of about 5 nm, and is coordinated with the operating voltage at 3.3 V. Transistors 3 and 4 on the right-hand side, which are oriented toward the lower operating voltage of 1.8 V, in each case have a gate oxide having a significantly smaller thickness of about 3 nm. In this respect, the semiconductor circuit 5 corresponds to the prior art.

However, the different average temporal switching intervals of the respective transistor are additionally taken into account in the semiconductor circuit. While the transistors 1 and 3 have a duty cycle of 2 and are therefore regularly switched every second clock cycle, the transistors 2 and 4 have a duty cycle of 1000, which is greater by three orders of magnitude. On account of this, in a conventional circuit, the risk of damage to the gate oxide layer $GOX_2$ is significantly lower than, for instance, in the gate oxide of the first transistor $GOX_1$. Without adversely affecting the lifetime of the entire circuit 5, the gate oxide $GOX_2$ of the second transistor 2 can be reduced in order that the transistor can be controlled even better. The gate oxide $GOX_2$ is therefore only 4.5 nm thick, i.e. 10% less than the gate oxide $GOX_1$ of the first transistor. In the same way, the gate oxide $GOX_4$ of the transistor 4 is only 2.7 nm thick, 10% thinner than the gate oxide $GOX_3$ of the transistor 3. Although all four gate oxide layers $GOX_1$, $GOX_2$, $GOX_3$, $GOX_4$ were originally produced at the same time, their subsequent processing, in partial regions, has led to different layer thicknesses and hence to insulation of different strengths for the control electrodes, i.e. the gate contacts G1, G2, G3, G4 with respect to the semiconductor substrate.

The layer thicknesses, which cannot be directly discerned graphically, are specified in FIG. 1 by numerical specifications for the respective layer thickness d1, d2, d3, d4 of the corresponding gate oxide $GOX_1$, $GOX_2$, $GOX_3$, $GOX_4$. It goes without saying that four different gate oxide thicknesses need not necessarily be set. Even in the case of only two different oxide thicknesses—for instance of the transistors 1 and 2 in a semiconductor circuit which contains only the region operated with 3.3 V—it is possible, by virtue of the extent of the layer thickness reduction, to utilize the significantly higher duty cycle of the second transistor relative to that of the first for easier controllability of the second transistor. All the numerical specifications in FIG. 1 are only by way of example. This likewise relates to the concrete configuration of the transistors, which in this case contain by way of example a gate contact G, a source S and a drain D.

Figure 2:
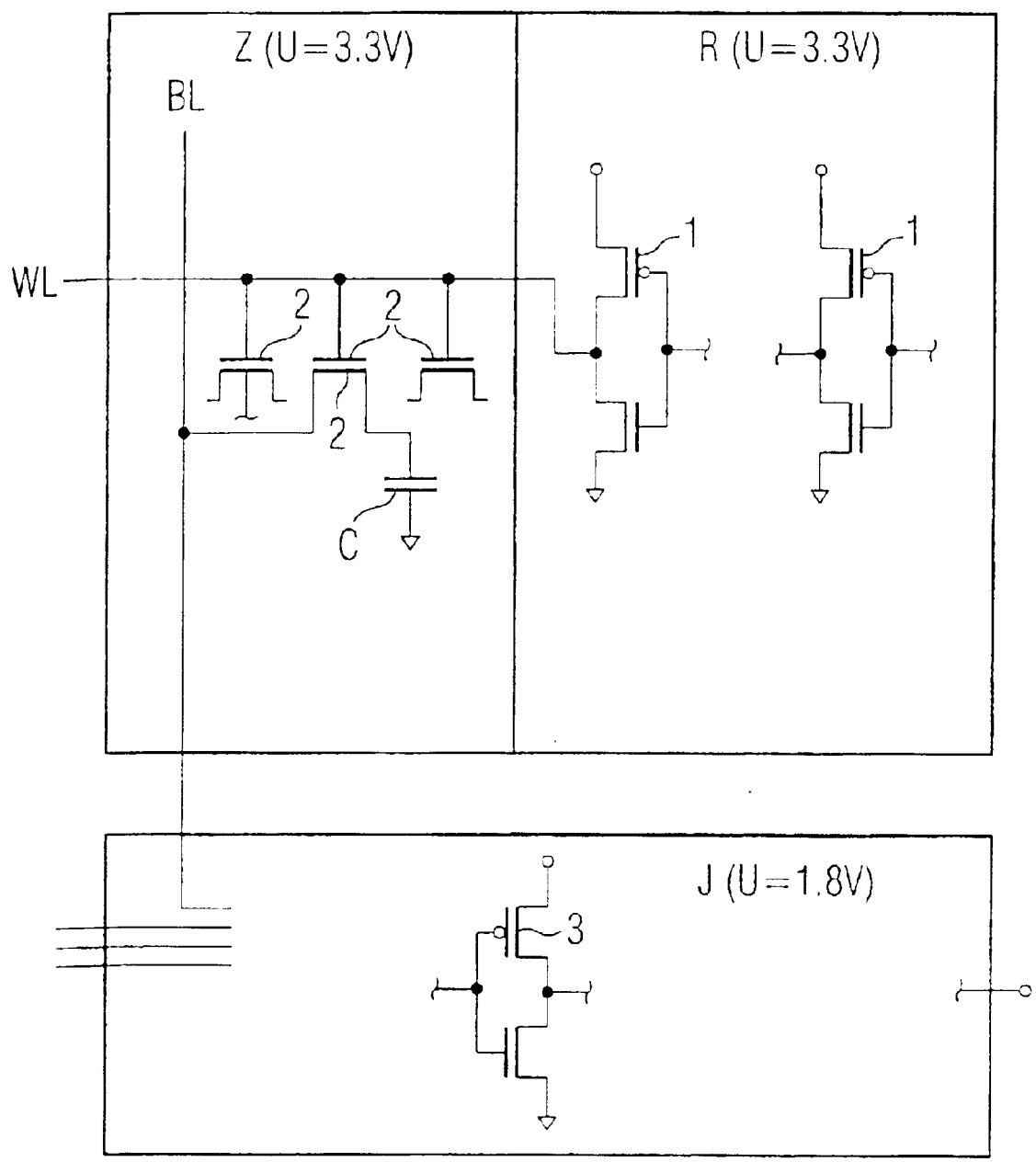
FIG. 2 is a circuit diagram of the semiconductor circuit according to the invention using the example of an embedded DRAM.

FIG. 2 diagrammatically shows an embedded DRAM, i.e. a volatile memory embedded in an ASIC or an application-specific logic circuit. The memory contains a cell array Z with a multiplicity of the transistors 2, which correspond to the transistors 2 from FIG. 1 and are accordingly operated with the same operating voltage U=3.3 V and the same duty cycle. Situated beside the cell array Z is a row path R, which has a multiplicity of the transistors 1 corresponding to the transistor 1 in FIG. 1. The row path contains a multiplicity of inverter circuits that are intended for the selection of word lines WL. The transistors 1 contained in the inverters are switched as often as the corresponding word line is selected. A multiplicity of memory cells are connected to each of the word lines WL. Each memory cell has the selection transistor 2, which is connected to the relevant word line WL and also to a respectively different bit line BL. FIG. 2 illustrates selection transistors 2 for three memory cells, the complete memory cell being illustrated for the middle selection transistor. It contains a storage capacitor C and the selection transistor 2, which, when it is selected, alters the charge present on the capacitor C. In practice, the number of memory cells per word line WL is as large as desired; by way of example, 1000 memory transistors may be provided per word line. The number of memory transistors may be between 1000 and 100,000, these specifications merely being by way of example. In FIG. 2, the transistors 1 and 2 are illustrated merely as representative of very much larger numbers of the relevant transistors.

An interface region J for a connection to further switching regions is provided below the cell array Z. A data path on which the information stored in the memory area is interrogated and transported runs in the interface. The data path contains transistors 3 which correspond to those with the same numbering from FIG. 1 and are operated with an operating voltage of just 1.8 V (U=1.8 V). Their switching frequency is considerably higher than that of the memory cells since, to a first approximation, each memory cell is interrogated with the same frequency, but the number of memory cells is very large. In practice, the switching frequency of the transistors 1 will be significantly greater than that of the transistors 2 since each transistor 1 is connected to a multiplicity of transistors 2 of the corresponding cell array (for example 2000 transistors 2). The circuit illustrated in FIG. 2, with the transistor 1 for the selection of a word line and the second transistor 2 for the selection of a memory cell, is only one possible example of connecting up the first transistor 1 and the second transistor 2 in such a way that the first transistor 1 and the second transistor 2 are switched with different frequencies on average over time. Realistically, the switching frequency of the transistors 1 is a factor of 1000 greater than that of the transistors 2, but still a factor of 16,000 less than the clock frequency or the switching frequency of the transistors 3 of the data path, the latter transistor essentially being switched with the clock frequency. A bandwidth of the average temporal switching intervals of 7 powers of 10 is thus achieved. Even greater switching intervals are conceivable depending on the complexity of the memory. The correction according to the invention therefore leads to a particularly efficient improvement of the transistor control.

Figure 3:
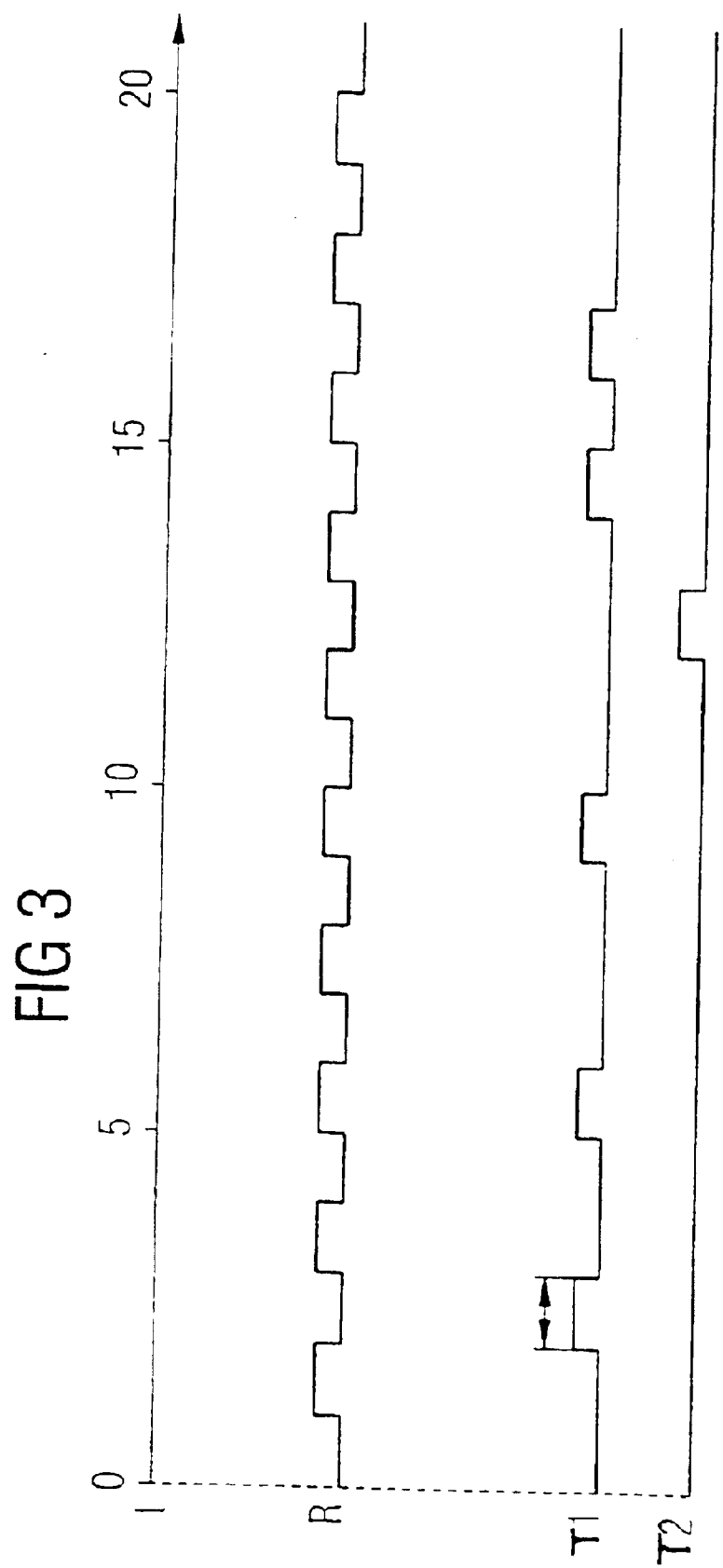
FIG. 3 is a graph showing a time profile of switching states of two transistors.

FIG. 3 shows, on a time axis t, a sequence of 20 clock pulses and below that a clock generator signal designated by R. The on and off states T1 and T2 of the transistors 1 and 2 are illustrated over the same temporal duration. The transistor 1 jumps into the on state and back again five times during the 20 clock cycles, which corresponds to a switching frequency of 10. On average, the transistor is thus switched every second clock cycle, which corresponds to an average time interval between two switching operations of two clock cycles. In contrast, the transistor 2 is switched only twice in total and thus has a duty cycle of 10 clock cycles. The duty cycle of the transistor 2 is thus a factor of 5 greater than that of the transistor 1, so that the lifetime of the transistor 2 is potentially longer. Therefore, the layer thickness of the gate oxide of the second transistor can be reduced without reducing the lifetime of the entire circuit.

All the numerical specifications in FIGS. 1 to 3 are only by way of example; their magnitude is determined only by the concrete respective semiconductor chip. Therefore, empirical values also reveal whether and to what extent gate oxide layers are made thinner in order to obtain the improved control of the transistor.

We claim:

1. An integrated semiconductor circuit, comprising:

two transistors, including a first transistor and a second transistor, operated with an operating voltage, said two transistors connected up such that said transistors are switched with different frequencies on average over time, said second transistor having an average switching frequency less than an average switching frequency of said first transistor, said first transistor having a first control electrode and a first dielectric layer disposed adjacent to said first control electrode, said second transistor having a second control electrode and a second dielectric layer disposed adjacent to said second control electrode, said second dielectric layer having a given thickness being less than a given thickness of said first dielectric layer.

2. The integrated semiconductor circuit according to claim 1, wherein said given thickness of said second dielectric layer is from 1 to 15% less than said given thickness of said first dielectric layer.

3. The integrated semiconductor circuit according to claim 1, wherein said average switching frequency of said second transistor is a factor of from 100 to $10^7$ less than said average switching frequency of said first transistor.

4. The integrated semiconductor circuit according to claim 1, further comprising a memory cell array having a memory cell partially formed by said second transistor, and said second transistor is a selection transistor by which said memory cell in said memory cell array is selected.

5. The integrated semiconductor circuit according to claim 4,
wherein said second transistor is one of a plurality of second transistors functioning as selection transistors;
wherein said memory cell array has a word line connected to said second transistors; and
further comprising a row path connected to said word line, said row path containing said first transistor and said first transistor is used for selecting said word line.

6. The integrated semiconductor circuit according to claim 5, wherein a number of said selection transistors connected to said word line is between one thousand and one hundred thousand.

7. The integrated semiconductor circuit according to claim 4, further comprising a third transistor having a further operating voltage that is less than the operating voltage of said first and second transistors, said third transistor having a control electrode and a third dielectric layer with a given thickness that is less than said given thickness of said second dielectric layer.

8. The integrated semiconductor circuit according to claim 7, further comprising a data path containing said third transistor, said data path connected to and forwarding information from said memory cell.

9. The integrated semiconductor circuit according to claim 7, further comprising a fourth transistor having a control electrode and a fourth dielectric layer, each of said first dielectric layer, said second dielectric layer, said third dielectric layer and said fourth dielectric layer have different thicknesses.

10. The integrated semiconductor circuit according to claim 9, wherein said first, second, third and fourth transistors are MOSFETs and said first, second, third and fourth control electrodes are gate electrodes.

11. The integrated semiconductor circuit according to claim 10, wherein said first, second, third and fourth dielectric layers are formed from gate oxides.

12. The integrated semiconductor circuit according to claim 1, wherein the integrated semiconductor circuit is configured for a defined clock frequency, and the average switching frequency of each of said two transistors is proportional to a duty ratio of each of said two transistors.

13. The integrated semiconductor circuit according to claim 4, wherein the integrated semiconductor circuit is an embedded dynamic random access memory.

14. The integrated semiconductor circuit according to claim 1, wherein said transistors form a logic circuit.

* * * * *